(12) United States Patent
Lee

(10) Patent No.: US 11,695,376 B2
(45) Date of Patent: Jul. 4, 2023

(54) PHASE-SYNCHRONIZED RF POWER GENERATOR

(71) Applicant: WAVEPIA CO., LTD., Gyeonggi-do (KR)

(72) Inventor: Sang-Hun Lee, Gyeonggi-do (KR)

(73) Assignee: WAVEPIA CO., LTD., Gyeonggi-do (KR)

( * ) Notice: Subject to any disclaimer, the term of this patent is extended or adjusted under 35 U.S.C. 154(b) by 302 days.

(21) Appl. No.: 17/198,762

(22) Filed: Mar. 11, 2021

(65) Prior Publication Data

US 2021/0288620 A1 Sep. 16, 2021

(30) Foreign Application Priority Data

Mar. 16, 2020 (KR) .......................... 10-2020-0031838

(51) Int. Cl.
*H03F 3/24* (2006.01)
*H03F 1/32* (2006.01)

(52) U.S. Cl.
CPC ........... *H03F 3/245* (2013.01); *H03F 1/3247* (2013.01); *H03F 2200/132* (2013.01); *H03F 2200/451* (2013.01)

(58) Field of Classification Search
CPC ..................................... H03F 3/24; H03F 1/32
USPC ........................................... 330/94, 278, 279
See application file for complete search history.

(56) References Cited

U.S. PATENT DOCUMENTS

| | | | | |
|---|---|---|---|---|
| 4,754,231 A * | 6/1988 | Sawa | .................... | H03G 3/3042 330/141 |
| 5,990,734 A * | 11/1999 | Wright | .................. | H03F 1/0294 330/149 |
| 6,054,894 A * | 4/2000 | Wright | .................. | H03F 1/3247 330/149 |
| 6,313,703 B1 * | 11/2001 | Wright | .................. | H03F 1/3247 330/149 |
| 2007/0241816 A1 * | 10/2007 | Okazaki | ................ | H03F 1/3282 330/149 |

FOREIGN PATENT DOCUMENTS

KR 1020120128370 11/2012

* cited by examiner

*Primary Examiner* — Henry Choe
(74) *Attorney, Agent, or Firm* — IPLA P.A.

(57) ABSTRACT

A phase-synchronized RF power generator includes: an RF power amplifier for amplifying an RF power signal; a first directional coupler; an isolator for adjusting impedance mismatch generated by the first directional coupler, and transferring the RF power signal transferred by the first directional coupler to the output terminal; a second directional coupler for transferring part of the feedback signal transferred by the first directional coupler to be compared with a frequency of a reference signal provided by a crystal oscillator, and transferring rest of the feedback signal to a feedback loop; a digital phase shifter for adjusting a phase of the feedback signal transferred by the second directional coupler at predetermined intervals; an analog phase shifter for continuously adjusting the phase of the feedback signal discretely adjusted by the digital phase shifter; and a frequency comparator.

5 Claims, 2 Drawing Sheets

PHASE-SYNCHRONIZED RF POWER GENERATOR

BACKGROUND

The present invention relates to a phase-synchronized RF power generator, and more specifically, to a phase-synchronized RF power generator, which can finely tune a frequency of an RF power signal of an RF power amplifier configured of a GaN High Electron Mobility Transistor (HEMT) by using a digital phase shifter and an analog phase shifter.

Owing to spread of Information and Communications Technologies (ICT), various activities carried out in outdoor spaces are performed indoors gradually. For this reason, the proportion of indoor space activities in daily life is gradually increasing, and services such as navigation and the like provided for the outdoor spaces are gradually expanded targeting the indoor spaces.

In order to satisfy the service demand, Radio Frequency (RF) products providing high performance are proposed, and high-power high-efficiency power oscillators are essential for the high-performance RF products.

Conventionally, in order to implement the high-power high-efficiency power oscillators described above, a cascade-type power amplifier should be added to the outside, and there is a difficulty in finely tuning the frequency of an RF power signal amplified by the power amplifier.

Background art of the present invention is disclosed in Korean Laid-opened Patent No. 10-2012-0128370.

SUMMARY OF THE INVENTION

Therefore, the present invention has been made in view of the above problems, and it is an object of the present invention to provide a phase-synchronized RF power generator, which can finely tune a frequency of an RF power signal of an RF power amplifier configured of a GaN High Electron Mobility Transistor (HEMT) by using a digital phase shifter and an analog phase shifter.

The technical problems to be solved by the present invention are not limited to those mentioned above, and unmentioned other technical problems may be clearly understood by those skilled in the art from the following descriptions.

To accomplish the above object, according to one aspect of the present invention, there is provided a phase-synchronized RF power generator including: an RF power amplifier for amplifying an RF power signal; a first directional coupler for transferring part of the RF power signal amplified by the RF power amplifier as a feedback signal, and transferring rest of the RF power signal to an output terminal; an isolator for adjusting impedance mismatch generated by the first directional coupler, and transferring the RF power signal transferred by the first directional coupler to the output terminal; a second directional coupler for transferring part of the feedback signal transferred by the first directional coupler to be compared with a frequency of a reference signal provided by a crystal oscillator, and transferring rest of the feedback signal to a feedback loop; a digital phase shifter for adjusting a phase of the feedback signal transferred by the second directional coupler at predetermined intervals; an analog phase shifter for continuously adjusting the phase of the feedback signal discretely adjusted by the digital phase shifter; and a frequency comparator for comparing the frequency of the reference signal provided by the crystal oscillator with a frequency of the RF power signal transferred by the second directional coupler, and providing information on a difference to the digital phase shifter and the analog phase shifter.

In the phase-synchronized RF power generator according to an embodiment of the present invention, the digital phase shifter preferably adjusts the phase of the feedback signal transferred by the second directional coupler at 5.625° intervals.

In the phase-synchronized RF power generator according to an embodiment of the present invention, the digital phase shifter is preferably configured of a first shifter for adjusting the phase of the feedback signal transferred by the second directional coupler by 180°, a second shifter for adjusting the phase of the feedback signal transferred by the second directional coupler by 90°, a third shifter for adjusting the phase of the feedback signal transferred by the second directional coupler by 45°, a fourth shifter for adjusting the phase of the feedback signal transferred by the second directional coupler by 22.5°, a fifth shifter for adjusting the phase of the feedback signal transferred by the second directional coupler by 11.25°, and a sixth shifter for adjusting the phase of the feedback signal transferred by the second directional coupler by 5.625°.

In the phase-synchronized RF power generator according to an embodiment of the present invention, the analog phase shifter is preferably configured of a 11-th inductor, a 11-th varactor and a 12-th varactor connected between both ends of the 11-th inductor, a 12-th inductor connected between a contact point of the 11-th varactor and the 12-th varactor and the ground, a 21-th inductor connected to the 11-th inductor, a 21-th varactor and a 22-th varactor connected between both ends of the 21-th inductor, and a 22-th inductor connected between the contact point of the 21-th varactor and the 22-th varactor and the ground.

In the phase-synchronized RF power generator according to an embodiment of the present invention, the RF power amplifier is preferably configured of a GaN High Electron Mobility Transistor (HEMI).

DETAILED DESCRIPTION OF THE PREFERRED EMBODIMENT

Figure 1:
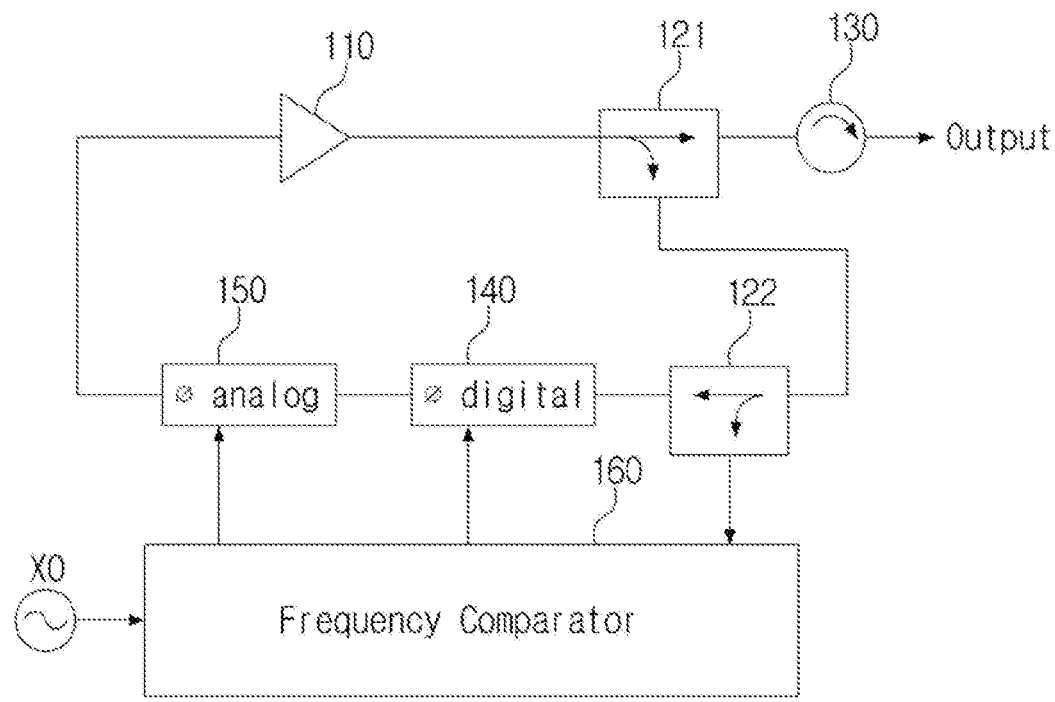
FIG. 1 is a block diagram showing a phase-synchronized RF power generator according to an embodiment of the present invention.

The detailed description of the present invention described below refers to the accompanying drawings, which illustrate specific embodiments in which the present invention may be embodied. These embodiments are described in detail to be sufficient for those skilled in the art to embody the present invention.

It should be understood that although various embodiments of the present invention are different from each other, they do not need to be mutually exclusive. For example, specific shapes, structures, and characteristics described herein may be implemented as another embodiment without departing from the spirit and scope of the present invention in relation to one embodiment.

In addition, it should be understood that the location or arrangement of individual components in each disclosed embodiment may be changed without departing from the spirit and scope of the present invention.

Accordingly, the detailed description described below is not intended to be taken in a limiting sense, and if properly described, the scope of the present invention is limited only by the appended claims, together with all scopes equivalent to those claimed by the claims.

In the drawings, similar reference numerals refer to the same or similar functions throughout several aspects, and the length, area, thickness and the like and the shapes thereof may be exaggerated for convenience.

As shown in FIG. 1, an RF power generator with a synchronized G phase according to an embodiment of the present invention may be configured to include an RF power amplifier 110, a first directional coupler 121, an isolator 130, a second directional coupler 122, a digital phase shifter 140, an analog phase shifter 150, and a frequency comparator 160.

Here, the RF power amplifier 110 amplifies an RF power signal, and specifically, it is configured to include a GaN High Electron Mobility Transistor (HEMI).

In addition, the first directional coupler 121 transfers part of the RF power signal amplified by the RF power amplifier as a feedback signal, and transfers the rest of the RF power signal to an output terminal, and the isolator 130 adjusts impedance mismatch generated by the first directional coupler 121 and transfers the RF power signal transferred by the first directional coupler 121 to the output terminal. The second directional coupler 122 transfers part of the feedback signal transferred by the first directional coupler 121 to be compared with the frequency of a reference signal provided by a crystal oscillator, and transfer the rest of the feedback signal to the digital phase shifter 140, which is a feedback loop.

Here, the frequency comparator 160 compares the frequency of the reference signal provided by the crystal oscillator with the frequency of the RF power signal transferred by the second directional coupler 122, and provides information on the difference to the digital phase shifter 140 and the analog phase shifter 150.

In addition, the digital phase shifter 140 adjusts the phase of the feedback signal transferred by the second directional coupler 122 at predetermined intervals, specifically, at 5.625° intervals.

Figure 2:
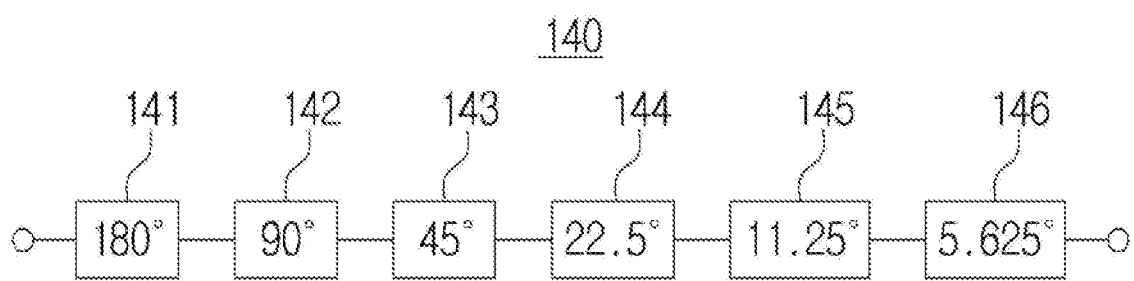
FIG. 2 is a block diagram showing a digital phase shifter employed in a phase-synchronized RF power generator according to an embodiment of the present invention.

As shown in FIG. 2, the digital phase shifter 140 described above is configured of a first shifter 141 for adjusting the phase of the feedback signal transferred by the second directional coupler 122 by 180°, a second shifter 142 for adjusting the phase of the feedback signal transferred by the second directional coupler 122 by 90°, a third shifter 143 for adjusting the phase of the feedback signal transferred by the second directional coupler 122 by 45°, a fourth shifter 144 for adjusting the phase of the feedback signal transferred by the second directional coupler 122 by 22.5°, a fifth shifter 145 for adjusting the phase of the feedback signal transferred by the second directional coupler 122 by 11.25°, and a sixth shifter 146 for adjusting the phase of the feedback signal transferred by the second directional coupler 122 by 5.625°, and may be controlled by a 6-bit digital code.

Meanwhile, the analog phase shifter 150 continuously adjusts the phase of the feedback signal discretely adjusted by the digital phase shifter 140.

Figure 3:
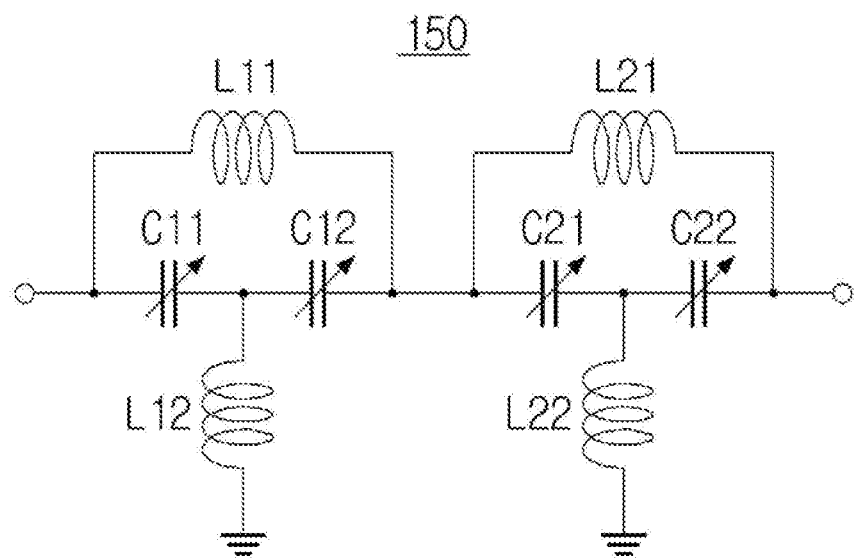
FIG. 3 is a block diagram showing an analog phase shifter employed in a phase-synchronized RF power generator according to an embodiment of the present invention.

Specifically, as shown in FIG. 3, the analog phase shifter 150 is configured of a 11-th inductor L11, a 11-th varactor C11 and a 12-th varactor C12 connected between both ends of the 11-th inductor L11, a 12-th inductor L12 connected between the contact point of the 11-th varactor C11 and the 12-th varactor C12 and the ground, a 21-th inductor L21 connected to the 11-th inductor L11, a 21-th varactor C21 and a 22-th varactor C22 connected between both ends of the 21-th inductor L21, and a 22-th inductor L22 connected between the contact point of the 21-th varactor C21 and the 22-th varactor C22 and the ground, and may continuously adjust the phase of the feedback signal discretely adjusted by the digital phase shifter 140 by adjusting the applied voltages of the 11-th varactor C11, the 12-th varactor C12, the 21-th varactor C21, and the 22-th varactor C22.

The phase-synchronized RF power generator according to the embodiments of the present invention may effectively adjust the frequency of an RF power signal of an RF power amplifier by finely tuning the phase of the RF power signal of the RF power amplifier configured of a GaN High Electron Mobility Transistor (HEMT) by using a digital phase shifter and an analog phase shifter.

Although the present invention has been described and illustrated above in relation to a preferred embodiment for illustrating the principle of the present invention, the present invention is not limited to the configurations and operations as illustrated and described as such.

Rather, those skilled in the art will fully understand that many changes and modifications can be made to the present invention without departing from the spirit and scope of the appended claims.

Accordingly, all such appropriate changes, modifications and equivalents should be considered as being in the scope of the present invention.

What is claimed is:

1. A phase-synchronized RF power generator comprising:
an RF power amplifier for amplifying an RF power signal;
a first directional coupler for transferring part of the RF power signal amplified by the RF power amplifier as a feedback signal, and transferring rest of the RF power signal to an output terminal;
an isolator for adjusting impedance mismatch generated by the first directional coupler, and transferring the RF power signal transferred by the first directional coupler to the output terminal;
a second directional coupler for transferring part of the feedback signal transferred by the first directional coupler to be compared with a frequency of a reference signal provided by a crystal oscillator, and transferring rest of the feedback signal to a feedback loop;
a digital phase shifter for adjusting a phase of the feedback signal transferred by the second directional coupler at predetermined intervals;
an analog phase shifter for continuously adjusting the phase of the feedback signal discretely adjusted by the digital phase shifter; and
a frequency comparator for comparing the frequency of the reference signal provided by the crystal oscillator with a frequency of the RF power signal transferred by the second directional coupler, and providing information on a difference to the digital phase shifter and the analog phase shifter.

2. The generator according to claim 1, wherein the digital phase shifter adjusts the phase of the feedback signal transferred by the second directional coupler at 5.625° intervals.

3. The generator according to claim 2, wherein the digital phase shifter is configured of a first shifter for adjusting the phase of the feedback signal transferred by the second directional coupler by 180°, a second shifter for adjusting the phase of the feedback signal transferred by the second directional coupler by 90°, a third shifter for adjusting the phase of the feedback signal transferred by the second directional coupler by 45°, a fourth shifter for adjusting the phase of the feedback signal transferred by the second directional coupler by 22.5°, a fifth shifter for adjusting the phase of the feedback signal transferred by the second directional coupler by 11.25°, and a sixth shifter for adjusting the phase of the feedback signal transferred by the second directional coupler by 5.625°.

4. The generator according to claim 1, wherein the analog phase shifter is configured of a 11-th inductor, a 11-th varactor and a 12-th varactor connected between both ends of the 11-th inductor, a 12-th inductor connected between a contact point of the 11-th varactor and the 12-th varactor and the ground, a 21-th inductor connected to the 11-th inductor, a 21-th varactor and a 22-th varactor connected between both ends of the 21-th inductor, and a 22-th inductor connected between the contact point of the 21-th varactor and the 22-th varactor and the ground.

5. The generator according to claim 1, wherein the RF power amplifier is configured of a GaN High Electron Mobility Transistor (HEMI).

\* \* \* \* \*